United States Patent
Maeda et al.

(10) Patent No.: US 9,331,122 B2
(45) Date of Patent: May 3, 2016

(54) SOLID-STATE IMAGING DEVICE WITH VARIED IMPURITY CONCENTRATION, METHOD FOR MANUFACTURING A SOLID-STATE IMAGING DEVICE, AND CAMERA MODULE INCLUDING A SOLID-STATE IMAGING DEVICE

(71) Applicant: Kabushiki Kaisha Toshiba, Minato-ku (JP)

(72) Inventors: Motohiro Maeda, Oita (JP); Nagataka Tanaka, Oita (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 197 days.

(21) Appl. No.: 14/161,051

(22) Filed: Jan. 22, 2014

(65) Prior Publication Data
US 2015/0042854 A1 Feb. 12, 2015

(30) Foreign Application Priority Data
Aug. 7, 2013 (JP) ................. 2013-164362

(51) Int. Cl.
*H04N 3/14* (2006.01)
*H01L 27/148* (2006.01)
*H01L 27/146* (2006.01)

(52) U.S. Cl.
CPC .......... *H01L 27/148* (2013.01); *H01L 27/1461* (2013.01); *H01L 27/14643* (2013.01); *H01L 27/14689* (2013.01)

(58) Field of Classification Search
CPC .................. H01L 27/14609; H01L 27/14603; H01L 27/14643
See application file for complete search history.

(56) References Cited

U.S. PATENT DOCUMENTS 6,072,206 A * 6/2000 Yamashita ........ H01L 27/14609
257/292
6,441,411 B2 * 8/2002 Nozaki ............. H01L 27/14643
257/292

(Continued)

FOREIGN PATENT DOCUMENTS

JP 2004-207520 7/2004
JP 2005-332925 12/2005

(Continued)

OTHER PUBLICATIONS

Office Action issued Jul. 24, 2015 in Taiwanese Patent Application No. 103100961 (with English language translation).

(Continued)

*Primary Examiner* — Sinh Tran
*Assistant Examiner* — Selam T Gebriel
(74) *Attorney, Agent, or Firm* — Oblon, McClelland, Maier & Neustadt, L.L.P (57) ABSTRACT

According to one embodiment of the present invention, a solid-state imaging device is provided. The solid-state imaging device includes a first-conductivity-type semiconductor region and a second-conductivity-type semiconductor region. The first-conductivity-type semiconductor region is disposed for each pixel of a captured image. The second-conductivity-type semiconductor region constitutes a photoelectric conversion element by a PN junction with the first-conductivity-type semiconductor region, and has second-conductivity-type impurity concentration that decreases from the center of the photoelectric conversion element toward a transfer gate side for transferring signal charge.

12 Claims, 8 Drawing Sheets

(56) References Cited

U.S. PATENT DOCUMENTS

| | | | |
|---|---|---|---|
| 6,472,699 B1* | 10/2002 | Sugiyama | H01L 27/14609 257/292 |
| 7,633,134 B2 | 12/2009 | Hynecek | |
| 8,120,069 B2 | 2/2012 | Hynecek | |
| 8,247,853 B2 | 8/2012 | Hynecek | |
| 2006/0022232 A1 | 2/2006 | Lim | |
| 2010/0243864 A1 | 9/2010 | Itonaga | |
| 2011/0298079 A1* | 12/2011 | Kawahito | H01L 27/14603 257/443 |
| 2012/0193745 A1* | 8/2012 | Onuki | H01L 27/14643 257/461 |
| 2012/0295386 A1 | 11/2012 | Hynecek | |

FOREIGN PATENT DOCUMENTS

| | | |
|---|---|---|
| JP | 2007-184520 | 7/2007 |
| JP | 2009-168742 | 7/2009 |
| JP | 2010-267709 | 11/2010 |
| JP | 2011-108824 | 6/2011 |
| KR | 10-0868646 | 11/2008 |

OTHER PUBLICATIONS

Office Action issued on Aug. 13, 2015 in the corresponding Korean patent Application No. 10-2014-0016396 (with English Translation).
Office Action issued Mar. 18, 2015 in Korean Patent Application No. 10-2014-0016396 (with English translation).

* cited by examiner

SOLID-STATE IMAGING DEVICE WITH VARIED IMPURITY CONCENTRATION, METHOD FOR MANUFACTURING A SOLID-STATE IMAGING DEVICE, AND CAMERA MODULE INCLUDING A SOLID-STATE IMAGING DEVICE

CROSS-REFERENCE TO RELATED APPLICATION

This application is based upon and claims the benefit of priority from Japanese Patent Application No. 2013-164362, filed on Aug. 7, 2013; the entire contents of which are incorporated herein by reference.

FIELD

Embodiments described herein relate generally to a solid-state imaging device, a method for manufacturing the solid-state imaging device and a camera module.

BACKGROUND

Conventionally, electronic devices such as a digital camera and a portable terminal with a camera function each include a camera module with a solid-state imaging device. The solid-state imaging device includes a plurality of photoelectric conversion elements two-dimensionally arranged corresponding to the respective pixels of a captured image. Each photoelectric conversion element photoelectrically converts incident light into electric charge of an amount corresponding to an amount of the received light and accumulates the electric charges as signal electric charges indicating luminance of each pixel.

The solid-state imaging device transfers the signal charge accumulated in each photoelectric conversion element to a charge retention unit referred to as a floating diffusion for conversion into voltage, and amplifies the converted voltage so as to output the amplified voltage as an image signal.

In this solid-state imaging device, in the case where the signal charge is transferred from the photoelectric conversion element to the floating diffusion, the signal charge might not be partially transferred and remain in the photoelectric conversion element. The signal charge that has not been transferred and remains in the photoelectric conversion element appears as an afterimage in the captured image. This may cause image degradation.

DETAILED DESCRIPTION

According to one embodiment of the present invention, a solid-state imaging device is provided. The solid-state imaging device includes a first-conductivity-type semiconductor region and a second-conductivity-type semiconductor region. The first-conductivity-type semiconductor region is disposed for each pixel of a captured image. The second-conductivity-type semiconductor region constitutes a photoelectric conversion element by a PN junction with the first-conductivity-type semiconductor region, and has second-conductivity-type impurity concentration that decreases from a center of the photoelectric conversion element toward a transfer gate side for transferring signal charge.

Exemplary embodiments of a solid-state imaging device, a camera module, a method for manufacturing the solid-state imaging device, and a camera module will be explained below in detail with reference to the accompanying drawings. The present invention is not limited to the following embodiments.

First Embodiment

Figure 1:
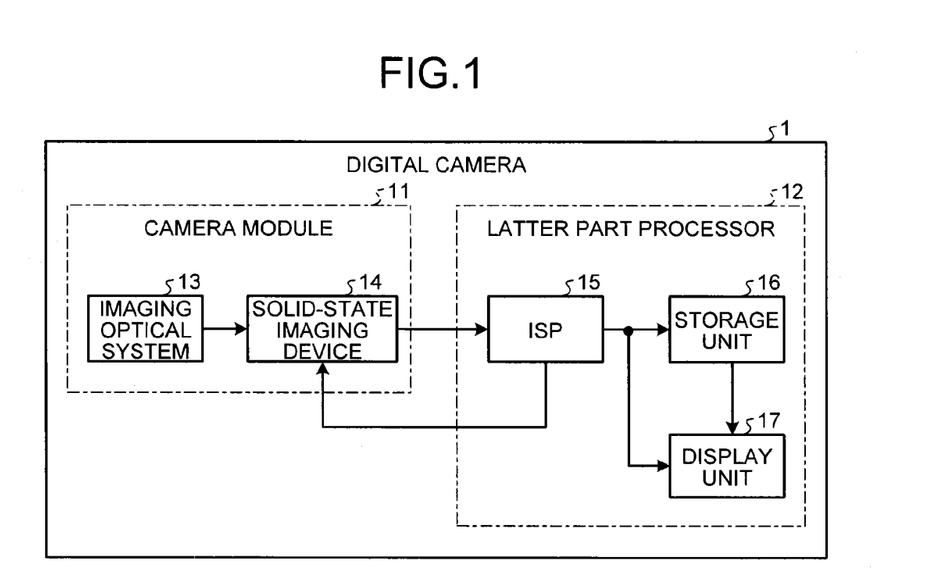
FIG. 1 is a block diagram illustrating a schematic configuration of a digital camera with a solid-state imaging device according to a first embodiment.

FIG. 1 is a block diagram illustrating a schematic configuration of a digital camera 1 with a solid-state imaging device 14 according to a first embodiment. As illustrated in FIG. 1, the digital camera 1 includes a camera module 11 and a latter part processor 12.

The camera module 11 includes an imaging optical system 13 and the solid-state imaging device 14. The imaging optical system 13 receives light from a photographic subject and forms an image of a photographic subject image. The solid-state imaging device 14 takes the photographic subject image formed by the imaging optical system 13, and outputs an image signal obtained by taking the image to the latter part processor 12. This camera module 11 is applied, for example, to electronic devices such as a portable terminal with camera in addition to the digital camera 1.

The latter part processor 12 includes an Image Signal Processor (ISP) 15, a storage unit 16, and a display unit 17. The ISP 15 performs a signal process of the image signal input from the solid-state imaging device 14. This ISP 15 performs, for example, a high quality image process such as a denoising process, a defective pixel correction process, and a resolution conversion process.

Figure 2:
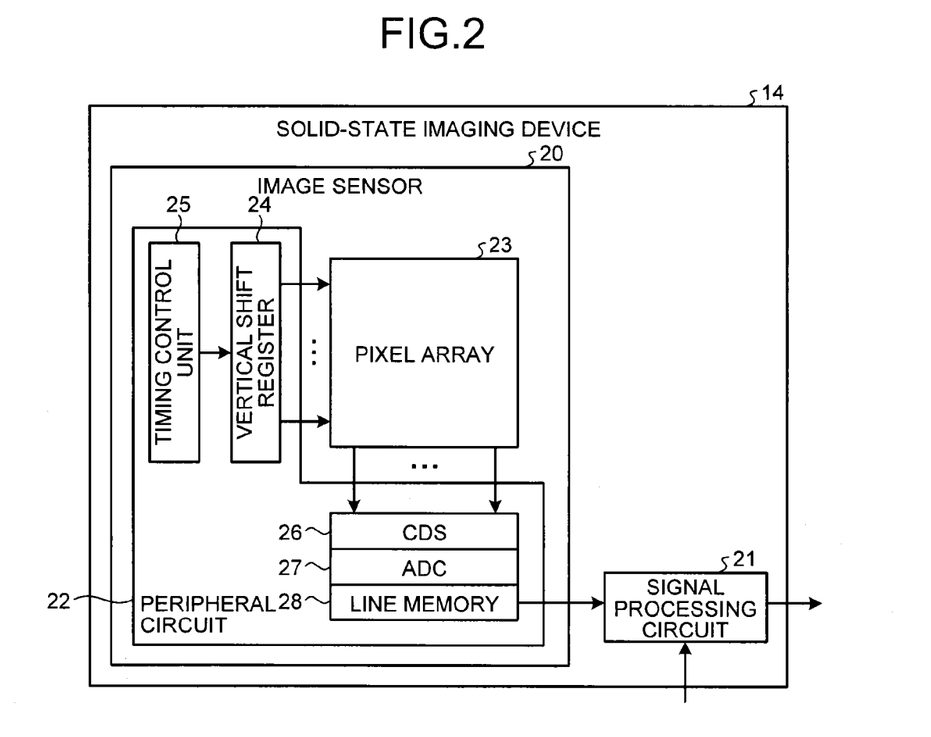
FIG. 2 is a block diagram illustrating a schematic configuration of the solid-state imaging device according to the first embodiment.

Then, the ISP 15 outputs the image signal after the signal process to the storage unit 16, the display unit 17, and a signal processing circuit 21, which will be described below (see FIG. 2). The signal processing circuit 21 is included in the solid-state imaging device 14 in the camera module 11. The image signal fed back from the ISP 15 to the camera module 11 is used for adjustment and control of the solid-state imaging device 14.

The storage unit 16 stores the image signal input from the ISP 15 as an image. The storage unit 16 outputs the image signal of the stored image to the display unit 17 according to, for example, an operation by the user. The display unit 17 displays an image corresponding to the image signal input from the ISP 15 or the storage unit 16. This display unit 17 is, for example, a liquid crystal display.

Next, with reference to FIG. 2, the solid-state imaging device 14 included in the camera module 11 will be described. FIG. 2 is a block diagram illustrating a schematic configuration of the solid-state imaging device 14 according to the first embodiment. As illustrated in FIG. 2, the solid-state imaging device 14 includes an image sensor 20 and the signal processing circuit 21.

Here, a description will be given of the case where the image sensor 20 is a so-called front-illuminated Complementary Metal Oxide Semiconductor (CMOS) image sensor. In the front-illuminated CMOS image sensor, an interconnection layer is formed at a surface side where incident light for the photoelectric conversion element, which photoelectrically-converts the incident light, enters.

The image sensor 20 according to this embodiment is not limited to the front-illuminated CMOS image sensor. The image sensor 20 may be any given image sensor, for example, a back-illuminated CMOS and a Charge Coupled Device (CCD) image sensor.

The image sensor 20 includes a peripheral circuit 22 and a pixel array 23. The peripheral circuit 22 includes a vertical shift register 24, a timing control unit 25, a correlated double sampling unit (CDS) 26, an analog-to-digital converter (ADC) 27, and a line memory 28.

The pixel array 23 is disposed in an imaging area of the image sensor 20. In the pixel array 23, a plurality of photoelectric conversion elements corresponding to respective pixels of the captured image are disposed in the horizontal direction (row direction) and the vertical direction (column direction) in a two-dimensional array pattern (matrix pattern). In the pixel array 23, each photoelectric conversion element corresponding to each pixel generates a signal charge (for example, electrons) corresponding to an amount of incident light, and accumulates the signal charge.

The timing control unit 25 is a processor that outputs a pulse signal to the vertical shift register 24. The pulse signal becomes a reference of operation timing. The vertical shift register 24 is a processor that outputs a selection signal to the pixel array 23. The selection signal is a signal for sequentially selecting a photoelectric conversion element to read out the signal charge among the plurality of photoelectric conversion elements, which are arranged in an array (matrix) pattern, in units of lines.

In the pixel array 23, the signal charge accumulated in each photoelectric conversion element to be selected with a selection signal input from the vertical shift register 24 in units of lines is output from the photoelectric conversion element to the CDS 26 as a pixel signal indicating luminance of a corresponding pixel.

The CDS 26 is a processor that removes noise from the pixel signal input from the pixel array 23 by correlated double sampling and then outputs the pixel signal to the ADC 27. The ADC 27 is a processor that converts an analog pixel signal input from the CDS 26 into a digital pixel signal and then outputs the digital pixel signal to the line memory 28. The line memory 28 is a processor that temporarily holds the pixel signals input from the ADC 27 and then outputs the pixel signals to the signal processing circuit 21 for each line of the photoelectric conversion elements in the pixel array 23.

The signal processing circuit 21 is a processor that performs a predetermined signal process to the pixel signal input from the line memory 28 and then outputs the pixel signal to the latter part processor 12. The signal processing circuit 21 performs a signal process, for example, lens shading correction, defect correction, and noise reduction process on the pixel signal.

Thus, in the image sensor 20, the plurality of photoelectric conversion elements arranged at the pixel array 23 photoelectrically converts incident light into signal charges in an amount corresponding to the amount of the received light and then accumulates the signal charges. Then, the peripheral circuit 22 reads out the signal charge accumulated in each photoelectric conversion element as a pixel signal, so as to take an image.

Figure 3:
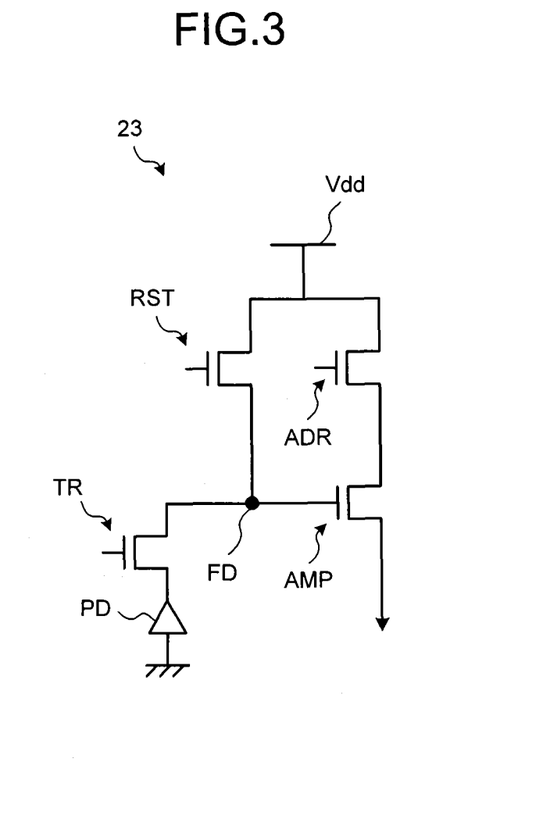
FIG. 3 is an explanatory diagram illustrating one example of a circuit configuration of a pixel array according to the first embodiment.

Next, a circuit configuration and an operation of this pixel array 23 will be briefly described with reference to FIG. 3. FIG. 3 is an explanatory diagram illustrating one example of the circuit configuration of the pixel array 23 according to the first embodiment. The circuit illustrated in FIG. 3 is a circuit selectively extracted from a part corresponding to one pixel of the captured image in the pixel array 23.

As illustrated in FIG. 3, the pixel array 23 includes a photoelectric conversion element PD, a transfer transistor TR, a floating diffusion FD, an amplifying transistor AMP, a reset transistor RST, and an address transistor ADR. Here, one photoelectric conversion element PD is disposed corresponding to one pixel. However, as a possible configuration, a plurality of the photoelectric conversion elements PD may be disposed corresponding to one pixel, and the plurality of the photoelectric conversion elements PD may share one floating diffusion FD.

The photoelectric conversion element PD is a photodiode that includes a cathode coupled to ground and an anode coupled to a source of the transfer transistor TR. The transfer transistor TR includes a drain coupled to the floating diffusion FD.

The transfer transistor TR transfers the signal charge, which has been photoelectrically converted by the photoelectric conversion element PD, to the floating diffusion FD when the gate electrode of the transfer transistor TR receives a transfer signal. The floating diffusion FD is coupled to a source of the reset transistor RST.

The reset transistor RST includes a drain coupled to a power supply voltage line Vdd. This reset transistor RST resets the electric potential of the floating diffusion FD to the electric potential of the power supply voltage when a gate electrode of the reset transistor RST receives a reset signal before the signal charge is transferred to the floating diffusion FD.

The floating diffusion FD is coupled to a gate electrode of the amplifying transistor AMP. This amplifying transistor AMP includes a source coupled to the CDS 26 and a drain coupled to a source of the address transistor ADR. The address transistor ADR includes a drain coupled to the power supply voltage line Vdd.

In the pixel array 23, when an address signal is input to a gate electrode of the address transistor ADR, a signal amplified corresponding to the electric charge amount of the signal charge that has been transferred to the floating diffusion FD is output from the amplifying transistor AMP to the CDS 26.

Each photoelectric conversion element PD included in the pixel array 23 of this embodiment has a configuration that reduces the signal charge that has not been transferred to the floating diffusion FD and remains in the photoelectric conversion element PD. Hereinafter, this configuration of the photoelectric conversion element PD will be described with reference to FIG. 4 to FIG. 6.

Figure 4:
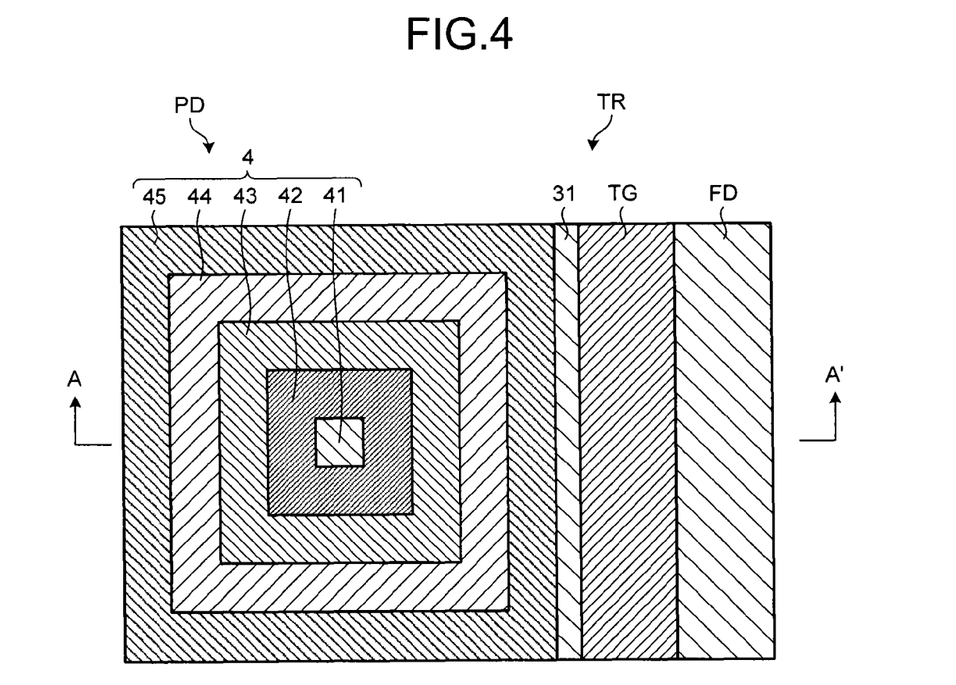
FIG. 4 is an explanatory view of a photoelectric conversion element according to the first embodiment viewed from a photo-receiving surface side.
Figure 5:
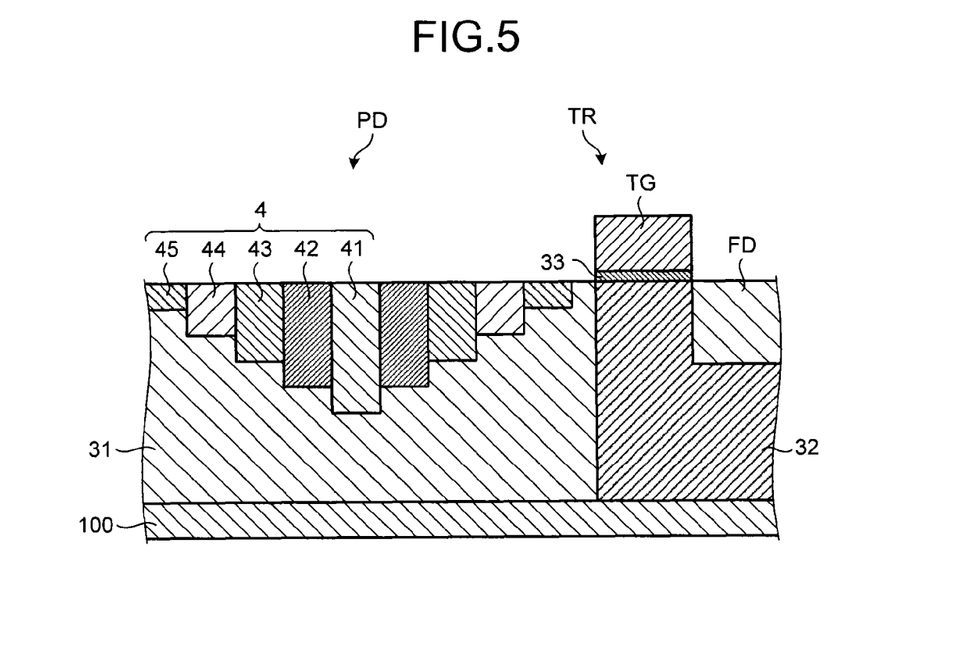
FIG. 5 is a cross-sectional view taken along the line A-A' illustrated in FIG. 4.
Figure 6:
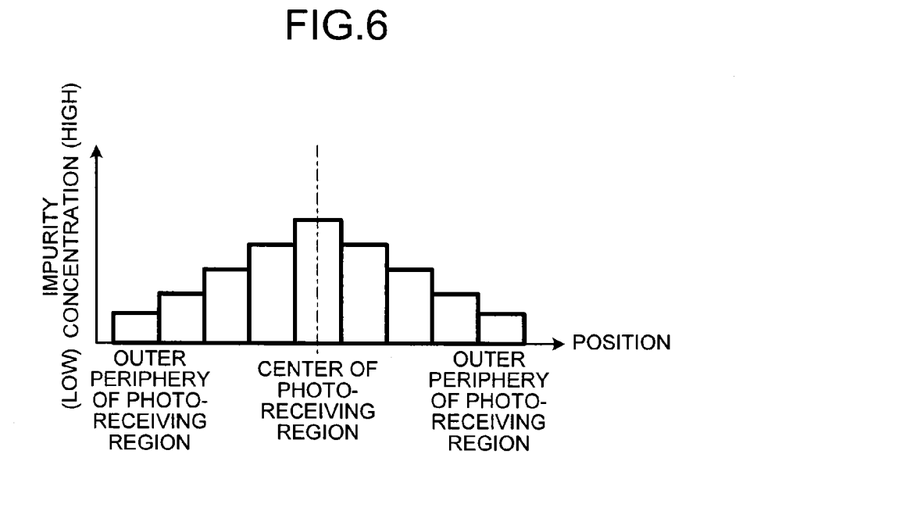
FIG. 6 is an explanatory view illustrating an impurity concentration distribution in a second-conductivity-type semiconductor region of the photoelectric conversion element according to the first embodiment.

FIG. 4 is an explanatory view of the photoelectric conversion element PD according to the first embodiment viewed from a photo-receiving surface side. FIG. 5 is a cross-sectional view taken along the line A-A' illustrated in FIG. 4. FIG. 6 is an explanatory view illustrating an impurity concentration distribution in a second-conductivity-type semiconductor region 4 of the photoelectric conversion element PD according to the first embodiment.

As illustrated in FIG. 5, the photoelectric conversion element PD includes, for example, a first-conductivity-type (here, "N-type") semiconductor (here, Si) region 31 disposed on a semiconductor substrate 100 such as a silicon (Si) wafer. This N-type Si region 31 is disposed for each pixel in the captured image.

Furthermore, the photoelectric conversion element PD includes a second-conductivity-type (here, "P-type") Si region 4 disposed on the N-type Si region 31. Thus, the photoelectric conversion element PD is a photodiode formed by the PN junction of the N-type Si region 31 and the P-type Si region 4.

The floating diffusion FD is disposed adjacent to the photoelectric conversion element PD via the transfer transistor TR for transferring the signal charge. The floating diffusion FD is formed by ion implantation of N-type impurity into a predetermined position in an element isolation area 32 that is formed of P-type Si disposed at the peripheral area of the photoelectric conversion element PD.

The transfer transistor TR includes a transfer gate TG disposed via a gate insulating film 33 on the top surface of the element isolation area 32 between the photoelectric conversion element PD and the floating diffusion FD. A predetermined transfer voltage is applied to this transfer gate TG, so as to transfer the signal charge from the photoelectric conversion element PD to the floating diffusion FD.

At this time, in the first embodiment, the impurity concentration and the depth in the P-type Si region 4 of the photoelectric conversion element PD are adjusted so as to reduce the signal charge that has not been transferred to the floating diffusion FD and remains in the photoelectric conversion element PD.

Specifically, the P-type Si region 4 is formed, as illustrated in FIG. 4 and FIG. 5, such that the thickness in a direction perpendicular to the photo-receiving surface of the photoelectric conversion element PD decreases, that is, the depth decreases from the center of the photo-receiving region of the photoelectric conversion element PD toward the outer periphery side of the photo-receiving region. Here, the center of the photo-receiving region denotes the center of the photo-receiving region viewed from the photo-receiving surface side of the photoelectric conversion element PD. The outer periphery side denotes the outer periphery side of the photo-receiving region viewed from the photo-receiving surface side of the photoelectric conversion element PD.

In FIG. 4 and FIG. 5, as one example, the P-type Si region 4 is constituted of five P-type regions of a first P-type region 41, a second P-type region 42, a third P-type region 43, a fourth P-type region 44, and a fifth P-type region 45. Here, the number of P-type regions constituting the P-type Si region is not limited to this.

Furthermore, the P-type Si region 4 is formed, as illustrated in FIG. 6, to have P-type impurity concentration that decreases from the center of the photo-receiving region of the photoelectric conversion element PD toward the outer periphery side of the photo-receiving region.

That is, within the P-type Si region 4, the first P-type region 41 has the highest P-type impurity concentration while the fifth P-type region 45 has the lowest P-type impurity concentration. Additionally, within the P-type Si region 4, the first P-type region 41 is formed to have the deepest depth while the fifth P-type region 45 is formed to have the shallowest depth.

Accordingly, the potential barrier distribution inside of the photoelectric conversion element PD is adjusted to have, for example, a flat-bottomed pan shape. This reduces the signal charge that has not been transferred to the floating diffusion FD and remains in the photoelectric conversion element PD. Hereinafter, a description will be given of operations and effects provided by this photoelectric conversion element PD with reference to FIG. 7 to FIG. 9.

Hereinafter, from the viewpoint of clarifying the operations and effects by the photoelectric conversion element PD, a typical photoelectric conversion element formed to have uniform depth and concentration distribution of the P-type Si region is compared with the photoelectric conversion element PD according to the first embodiment in this description.

Figure 7:
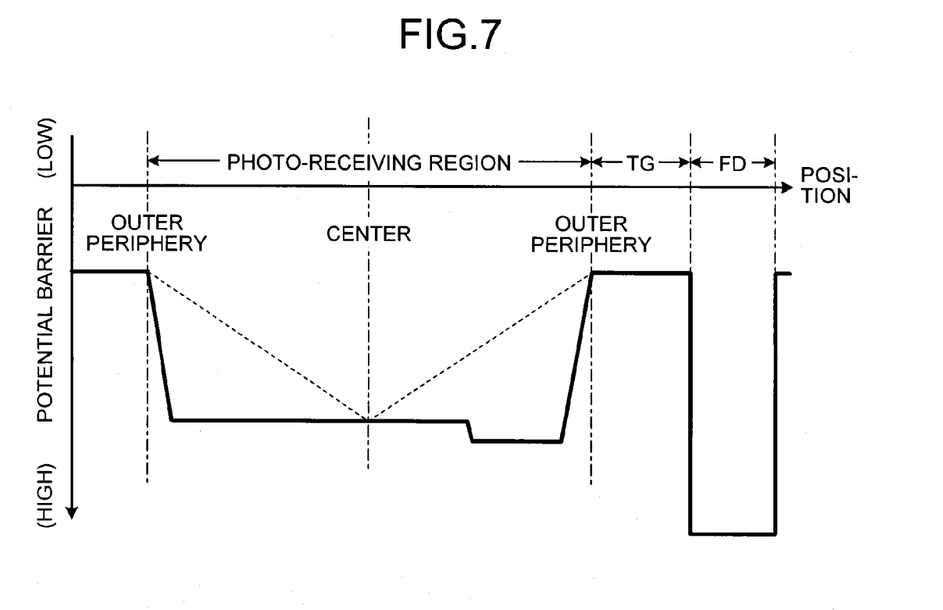
FIG. 7 is an explanatory diagram illustrating respective potential barrier distributions of the photoelectric conversion element according to the first embodiment and a typical photoelectric conversion element.

FIG. 7 is an explanatory diagram illustrating respective potential barrier distributions of the photoelectric conversion element PD according to the first embodiment and the typical photoelectric conversion element. FIG. 7 illustrates the potential barrier distribution in a state where the transfer voltage is not applied to the transfer gate TG. The potential barrier distribution of the photoelectric conversion element PD according to the first embodiment is indicated by a bold line. The potential barrier distribution of the typical photoelectric conversion element is indicated by a dotted line.

Figure 8:
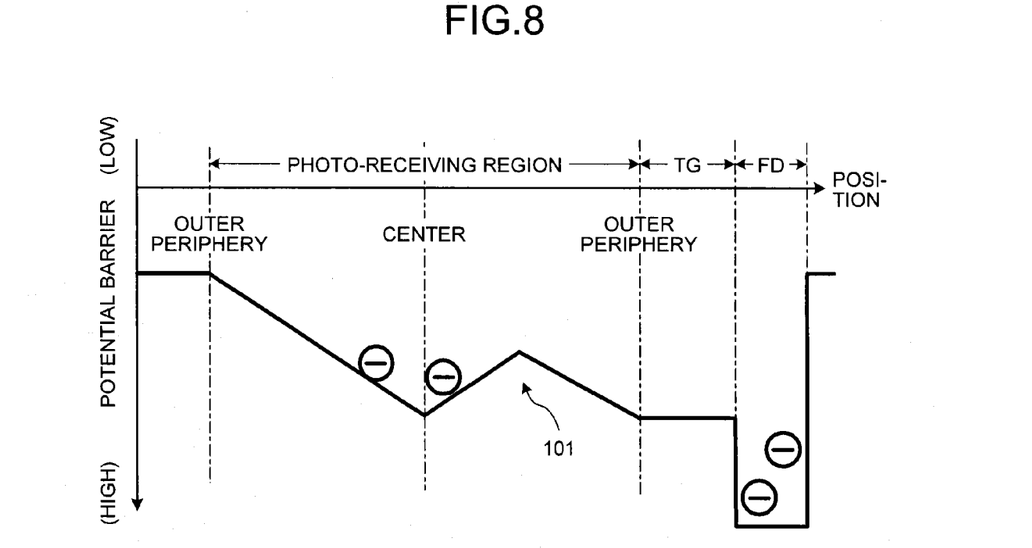
FIG. 8 is an explanatory diagram illustrating the potential barrier distribution of the typical photoelectric conversion element during transfer of signal charge.
Figure 9:
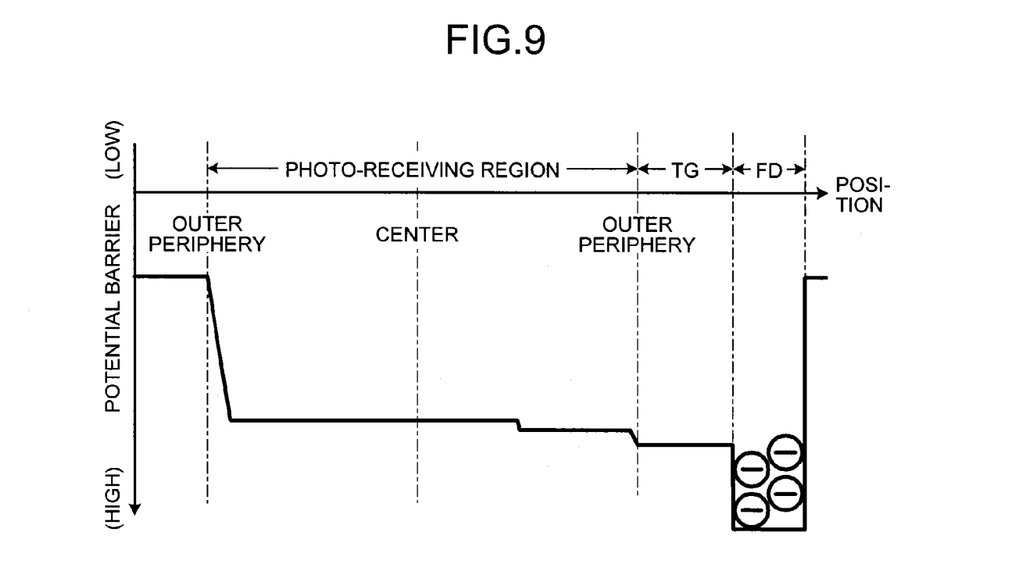
FIG. 9 is an explanatory diagram illustrating the potential barrier distribution of the photoelectric conversion element according to the first embodiment during transfer of signal charge.

FIG. 8 is an explanatory diagram illustrating the potential barrier distribution of the typical photoelectric conversion element during transfer of the signal charge. FIG. 9 is an explanatory diagram illustrating the potential barrier distribution of the photoelectric conversion element PD according to the first embodiment during transfer of the signal charge.

As illustrated by the dotted line of FIG. 7, in the typical photoelectric conversion element formed to have uniform depth and concentration distribution in the P-type Si region, the potential barrier increases from the periphery toward the center of the photo-receiving region by an effect of a P-type element isolation area that surrounds the peripheral area of an N-type Si region.

That is, in the typical photoelectric conversion element, the potential barrier distribution has a cone shape protruding to the surface side on the opposite side of the photo-receiving surface. At the proximity of the transfer gate TG in the photoelectric conversion element, a region with a comparatively low potential barrier is formed.

Accordingly, as illustrated in FIG. 8, in the typical photoelectric conversion element, in the case where the transfer voltage is applied to the transfer gate TG, a barrier 101 occurs between the center in the photo-receiving region and the outer periphery on the transfer gate TG side. The barrier 101 does not allow a sufficient increase in potential barrier. Accordingly, in the typical photoelectric conversion element, this barrier 101 becomes an obstacle. The signal charge might not be transferred to the floating diffusion FD and remain in the photoelectric conversion element.

In contrast, in the photoelectric conversion element PD according to the first embodiment, as described above, the P-type Si region 4 is formed to have a shallower depth and the P-type impurity concentration that decreases from the center toward the outer periphery of the photo-receiving region.

Accordingly, in the photoelectric conversion element PD, as illustrated in FIG. 7, the potential barrier has a flat-bottomed pan shape. That is, in the photoelectric conversion element PD, the potential barrier in the photo-receiving region becomes flatter and higher compared with the typical photoelectric conversion element.

As described above, the photoelectric conversion element PD provides an increased potential barrier adjacent to the transfer gate TG in the photo-receiving region in a state where the transfer voltage is not applied to the transfer gate TG, compared with the typical photoelectric conversion element.

Thus, as illustrated in FIG. 9, in the case where the transfer voltage is applied to the transfer gate TG, the photoelectric conversion element PD reduces the occurrence of the barrier 101 (see FIG. 8) between the center and the outer periphery at the transfer gate TG side of the photo-receiving region. Accordingly, the photoelectric conversion element PD reduces the signal charge that has not been transferred to the floating diffusion FD and remains in the photoelectric conversion element PD.

In the first embodiment, as illustrated in FIG. 4, the N-type Si region 31 is disposed between the photoelectric conversion element PD and the transfer gate TG. Accordingly, in the photoelectric conversion element PD, as illustrated in FIG. 7, a portion with a further increased potential barrier is formed at the proximity of the transfer gate TG in the photo-receiving region. This further improves signal charge transfer performance from the photoelectric conversion element PD to the floating diffusion FD.

Additionally, the P-type Si region 4 included in the photoelectric conversion element PD is formed to have a depth that increases from the outer periphery toward the center of the photo-receiving region. This increases the area of the PN junction compared with the typical photoelectric conversion element with the uniform depth of the P-type Si region. Accordingly, the photoelectric conversion element PD can have an increased amount of the signal charge (the saturation number of electrons) that can be accumulated, compared with the typical photoelectric conversion element, thus improving photoelectric conversion efficiency in the bright situation.

While in this embodiment the case where the P-type Si region 4 is formed to have a depth that decreases and to have P-type impurity concentration that decreases from the center toward the outer periphery of the photo-receiving region in the photoelectric conversion element PD has been described, the P-type Si region 4 may have a uniform depth.

Here, the P-type impurity concentration is designed to decrease from the center toward the outer periphery of the photo-receiving region even in the case where the P-type Si region 4 has a uniform depth. This configuration also increases the potential barrier in the photo-receiving region compared with the above-described typical photoelectric conversion element, thus improving the signal charge transfer performance to the floating diffusion FD.

Next, a description will be given of a method for manufacturing the solid-state imaging device 14 according to the first embodiment with reference to FIG. 10A to FIG. 10E. Among the manufacturing processes of the solid-state imaging device 14, manufacturing processes other than a process for forming the photoelectric conversion element PD are similar to those of the typical solid-state imaging device. Therefore, the process for forming the photoelectric conversion element PD will be described here.

Figure 10A:
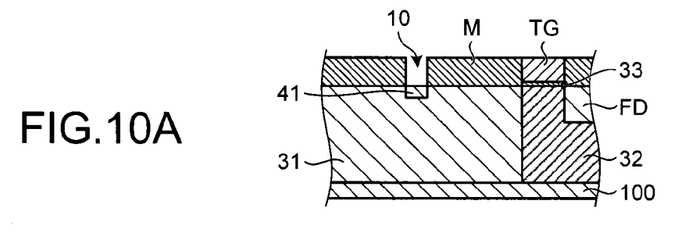
FIG. 10A to FIG. 10E are explanatory diagrams illustrating a process for forming the photoelectric conversion element according to the first embodiment.

FIG. 10A to FIG. 10E include explanatory diagrams illustrating the process for forming the photoelectric conversion element PD according to the first embodiment. In the process for forming the photoelectric conversion element PD, as illustrated in FIG. 10A, for example, P-type impurity such as boron is ion-implanted into a region except the formation region of the photoelectric conversion element PD in the semiconductor substrate 100 and then an annealing process is performed, so as to form the P-type element isolation area 32.

Subsequently, the gate insulating film 33 is formed of, for example, Si oxide in a predetermined position on the top surface of the element isolation area 32. On the top surface of the gate insulating film 33, the transfer gate TG formed of poly-Si is formed.

Subsequently, on both sides of the transfer gate TG, for example, ion implantation of N-type impurity such as phosphorus and a subsequent annealing process are performed. Accordingly, the N-type Si region 31 is formed in the formation position of each photoelectric conversion element PD. The floating diffusion FD is formed on the opposite side of the N-type Si region 31 across the transfer gate TG.

Subsequently, a mask M with an opening 10 is formed at the center on the top surface of the N-type Si region 31. For example, P-type impurity such as boron is ion-implanted into the N-type Si region 31 through the mask M, so as to form the first P-type region 41.

Figure 10B:
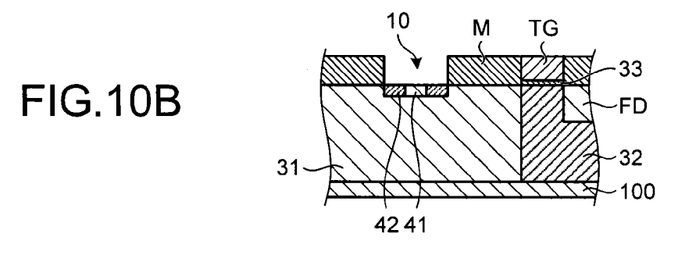

Subsequently, as illustrated in FIG. 10B, the opening 10 in the mask M is expanded and P-type impurity is ion-implanted into the N-type Si region 31 through the mask M to have lower impurity concentration than that of the first P-type region 41, so as to form the second P-type region 42. At this time, energy is applied to the P-type impurity at the same level as when forming the first P-type region 41, so as to perform the ion implantation.

Figure 10C:
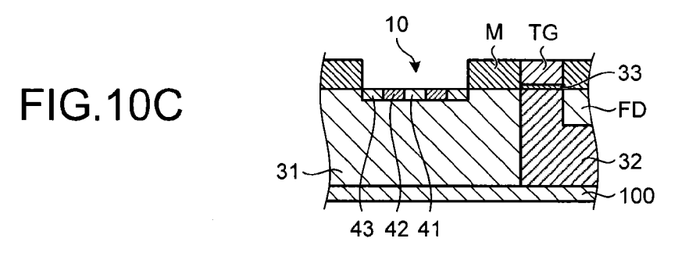

Subsequently, as illustrated in FIG. 10C, the opening 10 in the mask M is further expanded and P-type impurity is ion-implanted into the N-type Si region 31 through the mask M to have lower impurity concentration than that of the second P-type region 42, so as to form the third P-type region 43. At this time, energy is applied to the P-type impurity at the same level as when forming the first P-type region 41, so as to perform the ion implantation.

Figure 10D:
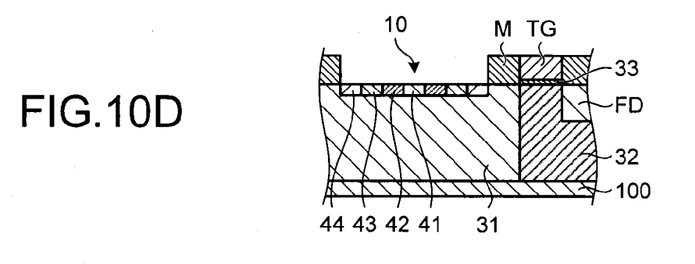

Subsequently, as illustrated in FIG. 10D, the opening 10 in the mask M is further expanded and P-type impurity is ion-implanted into the N-type Si region 31 through the mask M to have lower impurity concentration than that of the third P-type region 43, so as to form the fourth P-type region 44. At this time, energy is applied to the P-type impurity at the same level as when forming the first P-type region 41, so as to perform the ion implantation.

Figure 10E:
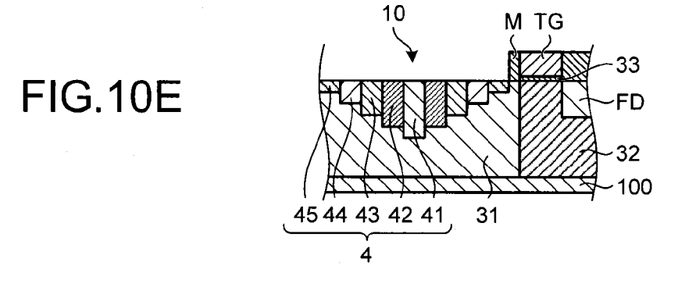

Additionally, as illustrated in FIG. 10E, the opening 10 in the mask M is expanded and P-type impurity is ion-implanted into the N-type Si region 31 through the mask M to have lower impurity concentration than that of the fourth P-type region 44, so as to form the fifth P-type region 45. At this time, energy is applied to the P-type impurity at the same level as when forming the first P-type region 41, so as to perform the ion implantation.

Accordingly, the first P-type region 41, the second P-type region 42, the third P-type region 43, the fourth P-type region 44, and the fifth P-type region 45 are formed to have respective uniform depths and P-type impurity concentration that decreases from the center toward the outer periphery of the photoelectric conversion element PD.

Finally, an annealing process is performed to thermally diffuse the P-type impurity. Accordingly, the higher P-type impurity concentration a region has, the deeper position the impurity is diffused to. This forms the P-type Si region 4 with a depth that decreases from the center toward the outer periphery of the photoelectric conversion element PD.

As described above, in the process for forming the photoelectric conversion element PD according to the first embodiment, one mask M is used and sequentially expands the opening 10 of the mask M, and the P-type impurity concentration is sequentially decreased. Then, the ion implantation forms the P-type Si region 4.

Additionally, this allows forming the P-type Si region 4 with the P-type impurity concentration that decreases from the center toward the outer periphery of the photo-receiving region while suppressing the increase in the number of the masks M to be used for forming the photoelectric conversion element PD.

In the ion implantation when the first to fifth P-type regions 41 to 45 are formed, in any case, a uniform energy is applied to the P-type impurity to perform the ion implantation, so as to simplify the setting of the process conditions for the ion implantation process.

After the first to fifth P-type regions 41 to 45 with the uniform depth are formed, an annealing process is simply performed to readily form the P-type Si region 4 with the depth that decreases from the center toward the outer periphery of the photo-receiving region.

A test is preliminary carried out and then the respective concentrations of P-type impurity in the first to fifth P-type regions 41 to 45 are adjusted such that the finally formed potential barrier distribution in the photoelectric conversion element PD has a flat-bottomed pan shape illustrated by a bold line in FIG. 7.

As described above, in the photoelectric conversion element PD according to the first embodiment, the P-type Si region 4 that forms the PN junction with the N-type Si region 31 is formed to have the depth in the direction perpendicular to the photo-receiving surface that sequentially decreases and to have P-type impurity concentration that decreases sequentially from the center toward the outer periphery of the photo-receiving region.

Accordingly, each photoelectric conversion element PD according to the first embodiment has the potential barrier distribution in a flat-bottomed pan shape, compared with another photoelectric conversion element with uniform P-type impurity concentration and depth. This photoelectric conversion element PD reduces the signal charge that has not been transferred to the floating diffusion FD and remains in the photoelectric conversion element PD, and increases the saturation number of electrons so as to improve the photoelectric conversion efficiency in the bright situation.

Second Embodiment

Next, a description will be given of a solid-state imaging device according to a second embodiment. The solid-state imaging device according to the second embodiment has different configurations of the photoelectric conversion element and the transfer gate, and is otherwise similar to the first embodiment. Therefore, here, a description will be given of a photoelectric conversion element PDa and a transfer gate TGa according to the second embodiment with reference to FIG. 11.

Figure 11:
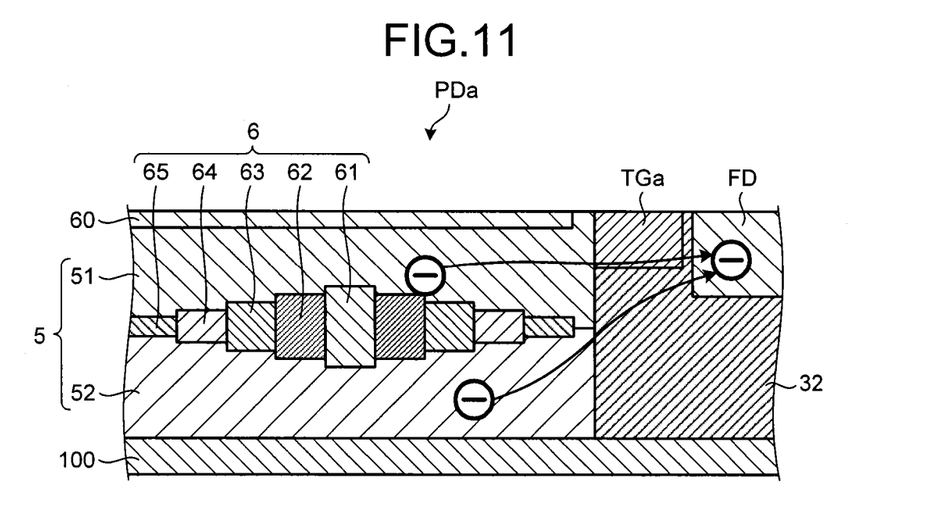
FIG. 11 is an explanatory diagram illustrating respective cross sections of a photoelectric conversion element and a transfer gate according to a second embodiment.

FIG. 11 is an explanatory diagram illustrating respective cross sections of the photoelectric conversion element PDa and the transfer gate TGa according to the second embodiment. Among the configuration members illustrated in FIG. 11, the same reference numerals illustrated in FIG. 5 are given to the same configuration members as the configuration members illustrated in FIG. 5.

As illustrated in FIG. 11, the photoelectric conversion element PDa includes an N-type Si region 5 and a P-type Si region 6 disposed inside of the N-type Si region 5. The P-type Si region 6 includes first to fifth P-type regions 61, 62, 63, 64, and 65 each formed to have a thickness in the direction perpendicular to the photo-receiving surface that sequentially decreases and to have P-type impurity concentration that sequentially decreases from the center toward the outer periphery in the photo-receiving region of the photoelectric conversion element PDa.

The first to fifth P-type regions 61, 62, 63, 64, and 65 are formed with similar processes to those illustrated in FIG. 10A to FIG. 10E, except that the ion implantation of the P-type impurity is performed with a higher energy than that of the case where the first to fifth P-type regions 41 to 45 are formed in the first embodiment.

Thus, the P-type Si region 6 is disposed inside of the N-type Si region 5 to have the thickness that sequentially decreases and to have the P-type impurity concentration that sequentially decreases from the center toward the outer periphery of the photo-receiving region. This also ensures a flat-bottomed pan shape of the potential barrier distribution of the photoelectric conversion element PDa. Accordingly, the photoelectric conversion element PDa reduces the signal charge that has not been transferred to the floating diffusion FD and remains in the photoelectric conversion element PDa.

Additionally, in the photoelectric conversion element PDa, the PN junction is formed on both sides of the photo-receiving surface side of the P-type Si region 6 and a surface side on the opposite side of the photo-receiving surface side. This ensures the further increased saturation number of electrons to further improve the photoelectric conversion efficiency in the bright situation.

The N-type Si region 5 in the photoelectric conversion element PDa includes an N-type first region 51 and an N-type second region 52. The N-type first region 51 is disposed on the photo-receiving surface side of the P-type Si region 6. The N-type second region 52 is disposed on the opposite side of the photo-receiving surface side of the P-type Si region 6.

The N-type second region 52 is formed to have lower N-type impurity concentration than that of the N-type first region 51. This reduces leakage of the signal charge accumulated in the joint between the N-type second region 52 and the P-type Si region 6 to the semiconductor substrate 100 side.

Furthermore, the second embodiment employs a buried gate where a transfer gate TGa is buried inside of the element isolation area 32. This allows efficient transfer of the signal charge to the floating diffusion FD also from the N-type second region 52 that does not readily transfer the signal charge, compared with the N-type first region 51 side.

The photoelectric conversion element PDa further includes a P-type Si layer 60 on the photo-receiving surface of the N-type Si region 5. This allows recombination between: electric charge (electrons) occurs in the N-type Si region 5 regardless of the light incidence, and holes in the P-type Si layer 60. Thus, the photoelectric conversion element PDa reduces the dark current.

As described above, the photoelectric conversion element PDa according to the second embodiment includes the P-type Si region 6 inside of the N-type Si region 5. The P-type Si region 6 is formed to have the thickness in the direction perpendicular to the photo-receiving surface that sequentially decreases and to have the P-type impurity concentration that sequentially decreases from the center toward the outer periphery of the photo-receiving region.

Accordingly, the photoelectric conversion element PDa reduces the signal charge that has not been transferred to the floating diffusion FD and remains in the photoelectric conversion element PDa, and further increases the saturation number of electrons. This ensures the further improved photoelectric conversion efficiency in the bright situation.

Third Embodiment

Next, a description will be given of a solid-state imaging device according to a third embodiment. The solid-state imaging device according to the third embodiment has a similar configuration to that described in the first embodiment except the photoelectric conversion element with a different configuration. Therefore, here, a description will be given of a photoelectric conversion element PDb according to the third embodiment with reference to FIG. 12 to FIG. 14.

Figure 12:
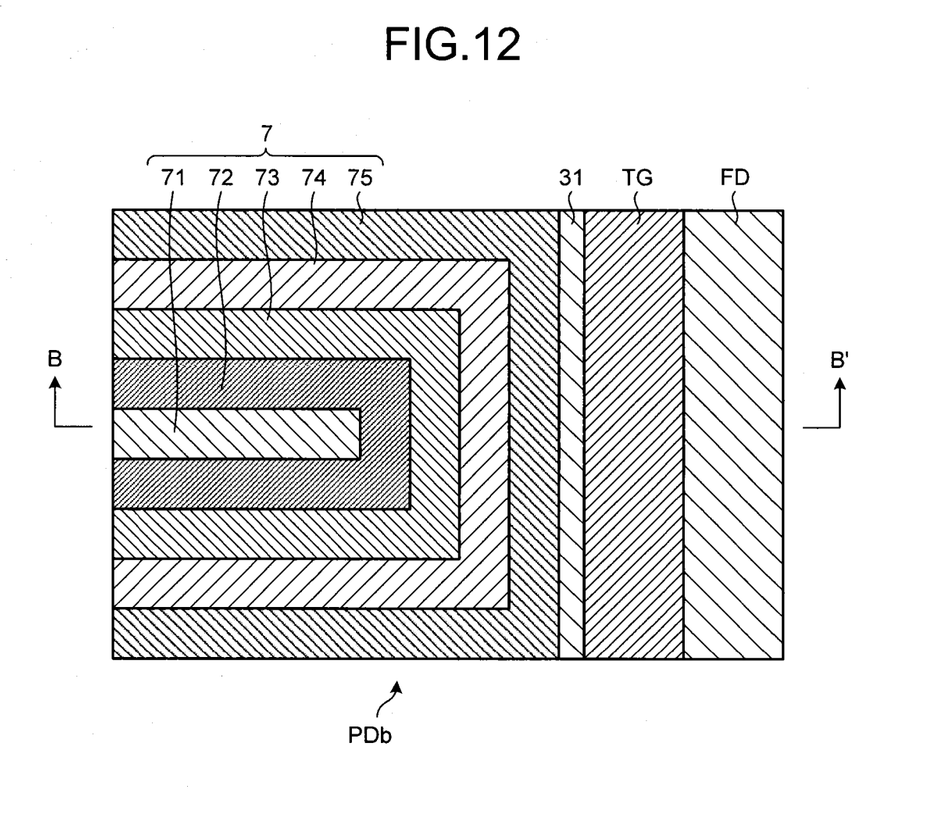
FIG. 12 is an explanatory diagram of a photoelectric conversion element according to a third embodiment viewed from a photo-receiving surface side.
Figure 13:
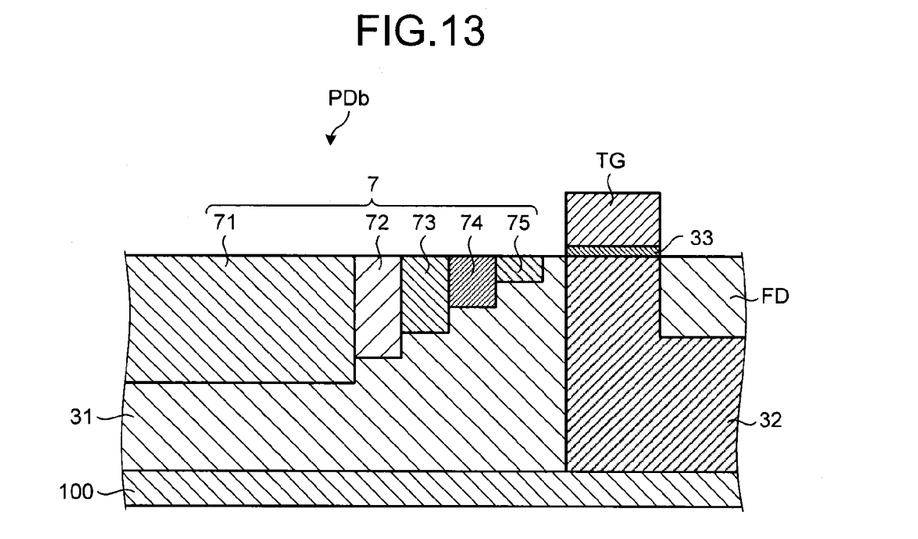
FIG. 13 is a cross-sectional view taken along the line B-B' illustrated in FIG. 12.
Figure 14:
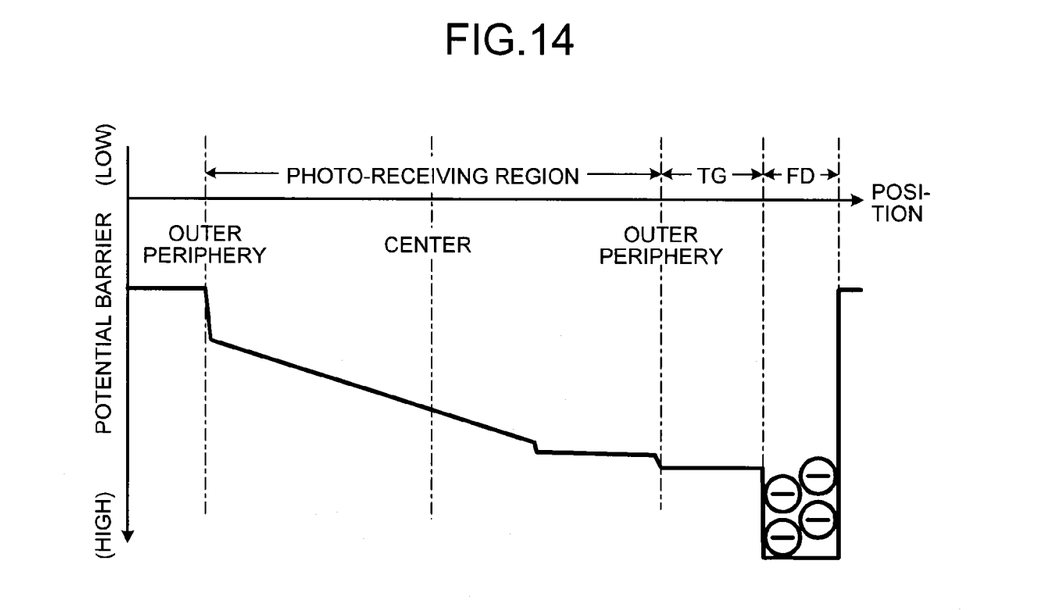
FIG. 14 is an explanatory diagram illustrating a potential barrier distribution of the photoelectric conversion element according to the third embodiment.

FIG. 12 is an explanatory diagram of the photoelectric conversion element PDb according to the third embodiment viewed from the photo-receiving surface side. FIG. 13 is a cross-sectional view taken along the line B-B' illustrated in FIG. 12. FIG. 14 is an explanatory diagram illustrating the potential barrier distribution of the photoelectric conversion element PDb according to the third embodiment. Among the configuration members illustrated in FIG. 12 and FIG. 13, the same reference numerals illustrated in FIG. 5 are given to the same configuration members as the configuration members illustrated in FIG. 5.

As illustrated in FIG. 12 and FIG. 13, the photoelectric conversion element PDb includes a P-type Si region 7 with a depth in the direction perpendicular to the photo-receiving surface that sequentially decreases and P-type impurity concentration that sequentially decreases, from the center of the photo-receiving region toward the outer periphery side on the photo-receiving surface. This outer periphery side excludes the outer periphery at the opposite side of the outer periphery at the transfer gate TG side.

This P-type Si region 7 is constituted of first to fifth P-type regions 71, 72, 73, 74, and 75. That is, within the P-type Si region 7, the first P-type region 71 is a region that has the deepest depth and the highest P-type impurity concentration. The fifth P-type region 75 is a region that has the shallowest depth and the lowest P-type impurity concentration.

The first to fifth P-type regions 71, 72, 73, 74, and 75 are formed with similar processes to those illustrated in FIG. 10A to FIG. 10E, except that the first to fifth P-type regions 71, 72, 73, 74, and 75 are formed with the opening 10 of the mask M illustrated in FIG. 10A to FIG. 10E in a position shifted toward the opposite side of the transfer gate TG on the photo-receiving surface while sequentially expanding the opening 10.

The potential barrier distribution of this photoelectric conversion element PDb has, as illustrated in FIG. 14, a gradient of the potential barrier that gradually increases from the outer periphery at the opposite side of the transfer gate TG toward the center in the photo-receiving region. Here, the potential barrier distribution from the center of the photo-receiving region to the transfer gate TG is similar to that of the first embodiment.

Accordingly, the photoelectric conversion element PDb reduces the signal charge that has not been transferred to the floating diffusion FD and remains in the photoelectric conversion element PDb, similarly to the photoelectric conversion element PD according to the first embodiment. Furthermore, in the photoelectric conversion element PDb, the signal charge accumulated in a region farther than the center of the photo-receiving region from the transfer gate TG is easily transferred to the floating diffusion FD by the gradient of the potential barrier from the outer periphery at the opposite side of the transfer gate TG toward the center.

Accordingly, the photoelectric conversion element PDb reduces the signal charge that has not been transferred to the floating diffusion FD and remains in the photoelectric conversion element PDb, for example, even in the case where the light-receiving area is extremely wide or even for use in the space outside the atmosphere.

As described above, the photoelectric conversion element PDb according to the third embodiment includes the P-type Si region 7 with the depth that sequentially decreases and the P-type impurity concentration that sequentially decreases from the center of the photo-receiving region toward the outer periphery side on the photo-receiving surface except the outer periphery at the opposite side of the outer periphery at the transfer gate TG side.

According to the photoelectric conversion element PDb, the signal charge accumulated in the region farther than the center of the photo-receiving region from the transfer gate TG is easily transferred to the floating diffusion FD. This improves the transfer performance of the signal charge in the case where the light-receiving area is extremely wide or for use in the space.

While in the above-described embodiments the case where the first to fifth P-type regions 41 to 45, 61 to 65, and 71 to 75 are in a rectangular shape viewed from the photo-receiving surface has been described, these regions may be formed in a concentric circular shape viewed from the photo-receiving surface. Accordingly, the potential barrier has an ideal distribution in a flat-bottomed pan shape that further improves the transfer efficiency of the signal charge to the floating diffusion FD.

Additionally, the P-type Si region 4 illustrated in FIG. 5 may be disposed instead of the P-type Si layer 60 illustrated in FIG. 11. This configuration further increases the area of the PN junction in the photoelectric conversion element PDa of the second embodiment, thus ensuring the further increased saturation number of electrons. This consequently improves the photoelectric conversion efficiency in the bright situation.

The P-type Si region 6 illustrated in FIG. 11 may be disposed inside of the N-type Si region 31 in the photoelectric conversion element PD illustrated in FIG. 5 and in the photoelectric conversion element PDb illustrated in FIG. 13. This configuration further increases the area of the PN junction, thus ensuring the further increased saturation number of electrons. This consequently improves the photoelectric conversion efficiency in the bright situation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device, comprising:
a first-conductivity-type semiconductor region disposed for each pixel of a captured image; and
a second-conductivity-type semiconductor region that constitutes a photoelectric conversion element by a PN junction with the first-conductivity-type semiconductor region, the second-conductivity-type semiconductor region having second-conductivity-type impurity concentration that decreases from a center of the photoelectric conversion element toward a transfer gate side for transferring signal charge, wherein
the second-conductivity-type semiconductor region has a thickness in a direction perpendicular to a photo-receiving surface of the photoelectric conversion element, the thickness increasing with increasing second-conductivity-type impurity concentration.

2. The solid-state imaging device according to claim 1, wherein
the second-conductivity-type semiconductor region is disposed inside of the first-conductivity-type semiconductor region, and
the first-conductivity-type semiconductor region includes:
a first region disposed on a photo-receiving surface side of the photoelectric conversion element with respect to the second-conductivity-type semiconductor region; and
a second region disposed on an opposite side of the photo-receiving surface of the photoelectric conversion element with respect to the second-conductivity-type semiconductor region.

3. The solid-state imaging device according to claim 1, wherein
the second-conductivity-type semiconductor region has second-conductivity-type impurity concentration that decreases from the center of the photoelectric conversion element toward an outer periphery side on a photo-receiving surface of the photoelectric conversion element.

4. The solid-state imaging device according to claim 1, wherein
the second-conductivity-type semiconductor region has second-conductivity-type impurity concentration that decreases from the center of the photoelectric conversion element toward an outer periphery side except an outer periphery at an opposite side of an outer periphery at the transfer gate side for transferring the signal charge on the photo-receiving surface of the photoelectric conversion element.

5. The solid-state imaging device according to claim 2, further comprising
a second-conductivity-type semiconductor layer on the photo-receiving surface of the photoelectric conversion element.

6. A method for manufacturing a solid-state imaging device, comprising:
forming a first-conductivity-type semiconductor region disposed for each pixel of a captured image; and
forming a second-conductivity-type semiconductor region that constitutes a photoelectric conversion element by a PN junction with the first-conductivity-type semiconductor region, the second-conductivity-type semiconductor region having second-conductivity-type impurity concentration that decreases from a center of the photoelectric conversion element toward a transfer gate side for transferring signal charge, wherein
forming the second-conductivity-type semiconductor region includes forming the second-conductivity-type semiconductor region that has a thickness in a direction perpendicular to a photo-receiving surface of the photoelectric conversion element, the thickness increasing with increasing second-conductivity-type impurity concentration.

7. The method for manufacturing the solid-state imaging device according to claim 6, further comprising
forming the second-conductivity-type semiconductor region to have second-conductivity-type impurity concentration that decreases from the center of the photoelectric conversion element toward an outer periphery side except an outer periphery at an opposite side of an outer periphery at the transfer gate side for transferring the signal charge on the photo-receiving surface of the photoelectric conversion element.

8. The method for manufacturing the solid-state imaging device according to claim 6, further comprising:
forming the first-conductivity-type semiconductor region by: forming a first-conductivity-type first region on a photo-receiving surface side of the photoelectric conversion element, and forming a first-conductivity-type second region on an opposite side of the photo-receiving surface of the photoelectric conversion element; and
forming the second-conductivity-type semiconductor region inside of the first-conductivity-type semiconductor region.

9. The method for manufacturing the solid-state imaging device according to claim 6, further comprising
forming the second-conductivity-type semiconductor region to have second-conductivity-type impurity concentration that decreases from the center of the photoelectric conversion element toward an outer periphery side on a photo-receiving surface of the photoelectric conversion element.

10. The method for manufacturing the solid-state imaging device according to claim 6, further comprising:
forming a mask with an opening on a top surface of the first-conductivity-type semiconductor region in a position corresponding to a center of the top surface; and
forming the second-conductivity-type semiconductor region by sequentially expanding the opening of the mask while ion-implanting second-conductivity-type impurity with sequentially decreased concentration into the first-conductivity-type semiconductor region from the opening, and then performing a heating process.

11. The method for manufacturing the solid-state imaging device according to claim 10, further comprising
performing ion implantation of the second-conductivity-type impurity with sequentially decreased concentration with a constant energy.

12. A camera module, comprising:
an imaging optical system configured to receive a light from a photographic subject to form an image of a photographic subject image; and
a solid-state imaging device configured to take the photographic subject image formed by the imaging optical system, wherein
the solid-state imaging device includes:
a first-conductivity-type semiconductor region disposed for each pixel of a captured image; and
a second-conductivity-type semiconductor region that constitutes a photoelectric conversion element by a PN junction with the first-conductivity-type semiconductor region, the second-conductivity-type semiconductor region having second-conductivity-type impurity concentration that decreases from a center of the photoelectric conversion element toward a transfer gate side for transferring signal charge, wherein
the second-conductivity-type semiconductor region has a thickness in a direction perpendicular to a photo-receiving surface of the photoelectric conversion element, the thickness increasing with increasing second-conductivity-type impurity concentration.

\* \* \* \* \*